(12) United States Patent
Kim

(10) Patent No.: US 8,368,297 B2
(45) Date of Patent: Feb. 5, 2013

(54) ORGANIC LIGHT EMITTING DEVICE

(75) Inventor: Young-II Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 339 days.

(21) Appl. No.: 12/421,632

(22) Filed: Apr. 9, 2009

(65) Prior Publication Data

US 2010/0052517 A1    Mar. 4, 2010

(30) Foreign Application Priority Data

Sep. 3, 2008    (KR) .................. 10-2008-0086894

(51) Int. Cl.
*H01J 1/62* (2006.01)
*G09G 3/14* (2006.01)
*G09G 3/30* (2006.01)

(52) U.S. Cl. .................. 313/504; 315/169.1; 315/169.3; 345/45; 345/46; 345/76; 345/55; 345/80; 257/88; 257/89; 257/92

(58) Field of Classification Search ............... 315/169.1, 315/169.3; 345/44–46, 55, 76–81; 257/88–93; 313/504

See application file for complete search history.

(56) References Cited

U.S. PATENT DOCUMENTS

| | | | | | |
|---|---|---|---|---|---|
| 2,380,721 | A | * | 7/1945 | Brigden | 47/48.5 |
| 3,188,771 | A | * | 6/1965 | Ballai | 47/47 |
| 3,345,774 | A | * | 10/1967 | Delbuguet | 47/48.5 |
| 3,373,525 | A | * | 3/1968 | Cavataio | 47/21.1 |
| 4,021,965 | A | * | 5/1977 | Norris | 47/48.5 |
| 4,158,269 | A | * | 6/1979 | Williams et al. | 47/48.5 |
| 4,192,096 | A | * | 3/1980 | Platt et al. | 47/73 |
| 4,393,622 | A | * | 7/1983 | Gallo, Sr. | 47/48.5 |
| 4,745,706 | A | * | 5/1988 | Muza et al. | 47/47 |
| 5,016,548 | A | * | 5/1991 | Ito | 111/114 |
| 5,067,274 | A | * | 11/1991 | Lewis | 47/47 |
| 6,307,324 | B1 | | 10/2001 | Hirano et al. | |
| D466,379 | S | * | 12/2002 | Barbi et al. | D8/1 |
| 6,843,020 | B2 | * | 1/2005 | Lutz | 47/48.5 |
| 6,964,124 | B2 | * | 11/2005 | Brode et al. | 43/132.1 |
| 7,227,184 | B2 | | 6/2007 | Park et al. | |
| 7,441,369 | B1 | * | 10/2008 | McAtee | 47/48.5 |
| 2005/0212418 | A1 | * | 9/2005 | Bae et al. | 313/506 |
| 2005/0258745 | A1 | * | 11/2005 | Tsujimura et al. | 313/506 |
| 2007/0242176 | A1 | * | 10/2007 | Chang et al. | 349/42 |
| 2007/0257606 | A1 | * | 11/2007 | Winters et al. | 313/505 |
| 2008/0005960 | A1 | * | 1/2008 | King | 47/48.5 |
| 2008/0209802 | A1 | * | 9/2008 | Williams | 47/47 |

FOREIGN PATENT DOCUMENTS

| | | |
|---|---|---|
| JP | 2002-189429 | 7/2002 |
| JP | 2007-310415 | 11/2007 |
| KR | 10-0502856 | 3/2004 |
| KR | 10-0453635 | 10/2004 |

(Continued)

*Primary Examiner* — Anne Hines
*Assistant Examiner* — Jacob R Stern
(74) *Attorney, Agent, or Firm* — Innovation Counsel LLP

(57) ABSTRACT

An organic light emitting device, according to an exemplary embodiment of the present invention, includes a thin film transistor array panel including a pixel electrode, an organic light emitting member formed on the pixel electrode, a common electrode formed on the organic light emitting member, and a storage capacitor including a first conductive layer and a second conductive layer overlapping each other via the organic light emitting member. The first conductive layer may be formed with the same layer as the pixel electrode, and the second conductive layer may be formed with the same layer as the common electrode.

20 Claims, 12 Drawing Sheets

FOREIGN PATENT DOCUMENTS

| KR | 10-0473226 | 2/2005 |
| KR | 10-2005-0086073 | 8/2005 |
| KR | 10-2005-0110792 | 11/2005 |
| KR | 10-0590255 | 6/2006 |
| KR | 10-0600878 | 7/2006 |
| KR | 10-2007-0076860 | 7/2007 |

* cited by examiner

ORGANIC LIGHT EMITTING DEVICE

CROSS-REFERENCE TO RELATED APPLICATIONS

This application claims priority to and the benefit of Korean Patent Application No. 10-2008-0086894, filed in the Korean Intellectual Property Office on Sep. 3, 2008, the entire contents of which are incorporated herein by reference.

BACKGROUND

1. Technical Field

The present invention relates generally to an organic light emitting device.

2. Related Art

Recently, as demands for lighter or thinner monitors or TVs have been increasing, cathode ray tubes (CRTs) are being replaced by flat panel displays (FPDs). Typical flat panel displays include a liquid crystal display, a field emission display, an organic light emitting device, and a plasma display panel.

Among the flat panel displays, the organic light emitting device has been receiving attention because of its low power consumption, fast response speed, wide viewing angle, and high contrast ratio. The organic light emitting device as a self-emissive display device includes two electrodes and an organic light emitting layer interposed between the two electrodes. One of the two electrodes injects holes and the other injects electrons into the light emitting layer. The injected electrons and holes are combined to form excitons, and the excitons emit light as discharge energy.

Generally, the luminance of the organic light emitting device is proportional to the area of the organic emission layer such that it is necessary to obtain a high aperture ratio to increase the luminance of the organic light emitting device. On the other hand, a storage capacitor to maintain a data signal of the organic light emitting device is necessary. If a gate-on voltage is applied to a switching transistor of the organic light emitting device, the data signal from the data line is input to a control terminal of the driving transistor. The organic light emitting member flows a current having a magnitude depending on a difference between the data signal and a driving voltage. The storage capacitor charges the data signal input to the control terminal of the driving transistor and maintains it after the switching transistor is turned off. To stably supply the current, it is important to maintain the data signal. Accordingly, it is preferable that the storage capacitance of the storage capacitor of the organic light emitting device is large.

Generally, the organic light emitting device includes a storage electrode and a storage electrode line to form the storage capacitor. The capacitor includes two conductive layers overlapping each other via an insulating layer therebetween, and the storage capacitance is proportional to the area of the two conductive layers such that the storage electrode and the storage electrode line have a wide area to form the storage capacitor having the high storage capacitance. However, the storage electrode and storage electrode line are simultaneously formed with the same layer as the opaque signal line such that the aperture ratio of the organic light emitting device is reduced according to the increase of the area of the storage electrode and the storage electrode line.

The above information disclosed in this background section is for enhancement of understanding of the background of the invention, and therefore, it may include information that does not form the prior art that is already known in this country to a person of ordinary skill in the art.

SUMMARY

One or more embodiments of the present invention provide an organic light emitting device including an organic capacitor having high storage capacitance without a reduction of aperture ratio of the organic light emitting device.

An organic light emitting device according to an exemplary embodiment of the present invention includes a thin film transistor array panel including a pixel electrode, an organic light emitting member formed on the pixel electrode, a common electrode formed on the organic light emitting member, and a storage capacitor including a first conductive layer and a second conductive layer overlapping each other via the organic light emitting member.

The first conductive layer may be formed with the same layer as the pixel electrode, and the second conductive layer may be formed with the same layer as the common electrode.

The second conductive layer may be separated from the common electrode.

The second conductive layer may be applied with a voltage from the exterior.

A voltage difference between the first conductive layer and the second conductive layer may be less than a light emitting threshold voltage of the organic light emitting member.

The second conductive layer may enclose a portion of the pixel electrode.

The thin film transistor array panel may include an insulation substrate, first and second transistors formed on the insulation substrate, a third conductive layer connected to the second transistor, and the second conductive layer contacting the third conductive layer.

The second conductive layer may be applied with a voltage from the third conductive layer.

The second conductive layer may be made of a transparent conductive material.

The second conductive layer may include indium-tin-oxide (ITO) or indium-zinc-oxide (IZO).

The organic light emitting member may include an organic emission layer and a plurality of auxiliary layers, and the first conductive layer and the second conductive layer may overlap via the organic emission layer and a portion of the plurality of auxiliary layers.

According to an exemplary embodiment of the present invention, the storage electrode made of the same layer as the pixel electrode and formed of a transparent material and the common electrode overlap the storage capacitor via an organic emission layer such that the storage capacitance may be increased without a reduction of the aperture ratio of the organic light emitting device.

DETAILED DESCRIPTION

Figure 1:
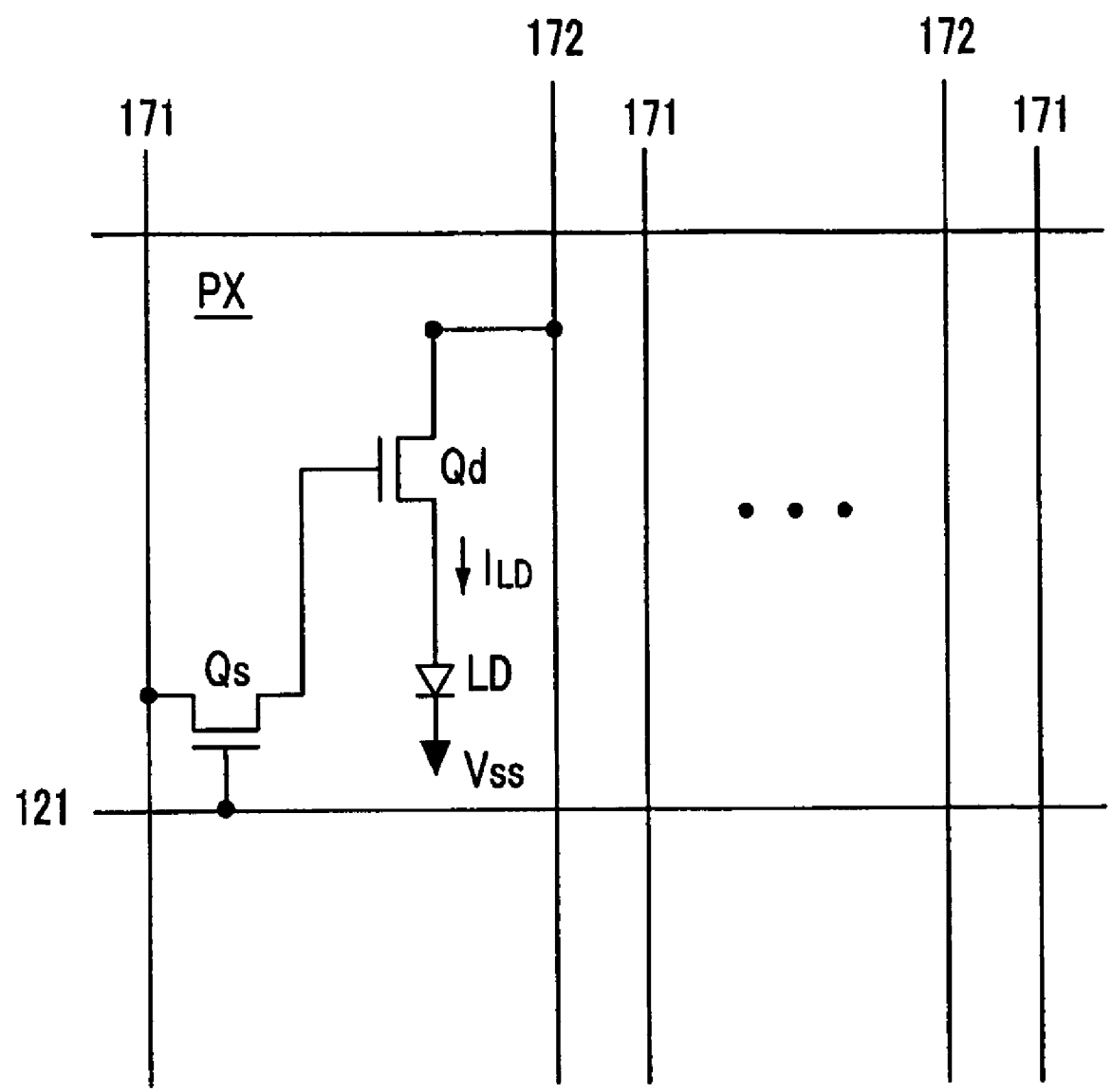
FIG. 1 is an equivalent circuit diagram of an organic light emitting device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a display panel according to an exemplary embodiment of the present invention will be described with reference to accompanying drawings in detail. First, an organic light emitting device according to an exemplary embodiment of the present invention will be described with reference to FIG. 1.

FIG. 1 is an equivalent circuit diagram of an organic light emitting device according to an exemplary embodiment of the present invention. Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and substantially parallel to each other, and the data lines 171 and the driving voltage lines 172 extend substantially in a column direction and substantially parallel to each other. Each pixel PX includes a switching transistor Qs, a driving transistor Qd, a capacitor Cst, and an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits the data signals applied to the data lines 171 to the driving transistor Qd in response to gate signals applied to the gate lines 121.

The driving transistor Qd has a control terminal connected to the switching transistor Qs, an input terminal connected to the driving voltage line 172, and an output terminal connected to the organic light emitting diode LD. The driving transistor Qd drives an output current ILD having a magnitude depending on the voltage between the control terminal and the output terminal thereof. Although not shown, the organic light emitting device according to an exemplary embodiment of the present invention includes a storage capacitor having a pixel electrode and a storage electrode overlapping each other via the organic light emitting member.

The storage capacitor stores a data signal applied to the control terminal of the driving transistor Qd and maintains the data signal after the switching transistor Qs turns off. The organic light emitting diode LD has an anode connected to the output terminal of the driving transistor Qd and a cathode connected to a common voltage Vss. The organic light emitting diode LD emits light having an intensity depending on an output current ILD of the driving transistor Qd, thereby displaying images. The switching transistor Qs and the driving transistor Qd are n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

Figure 2:
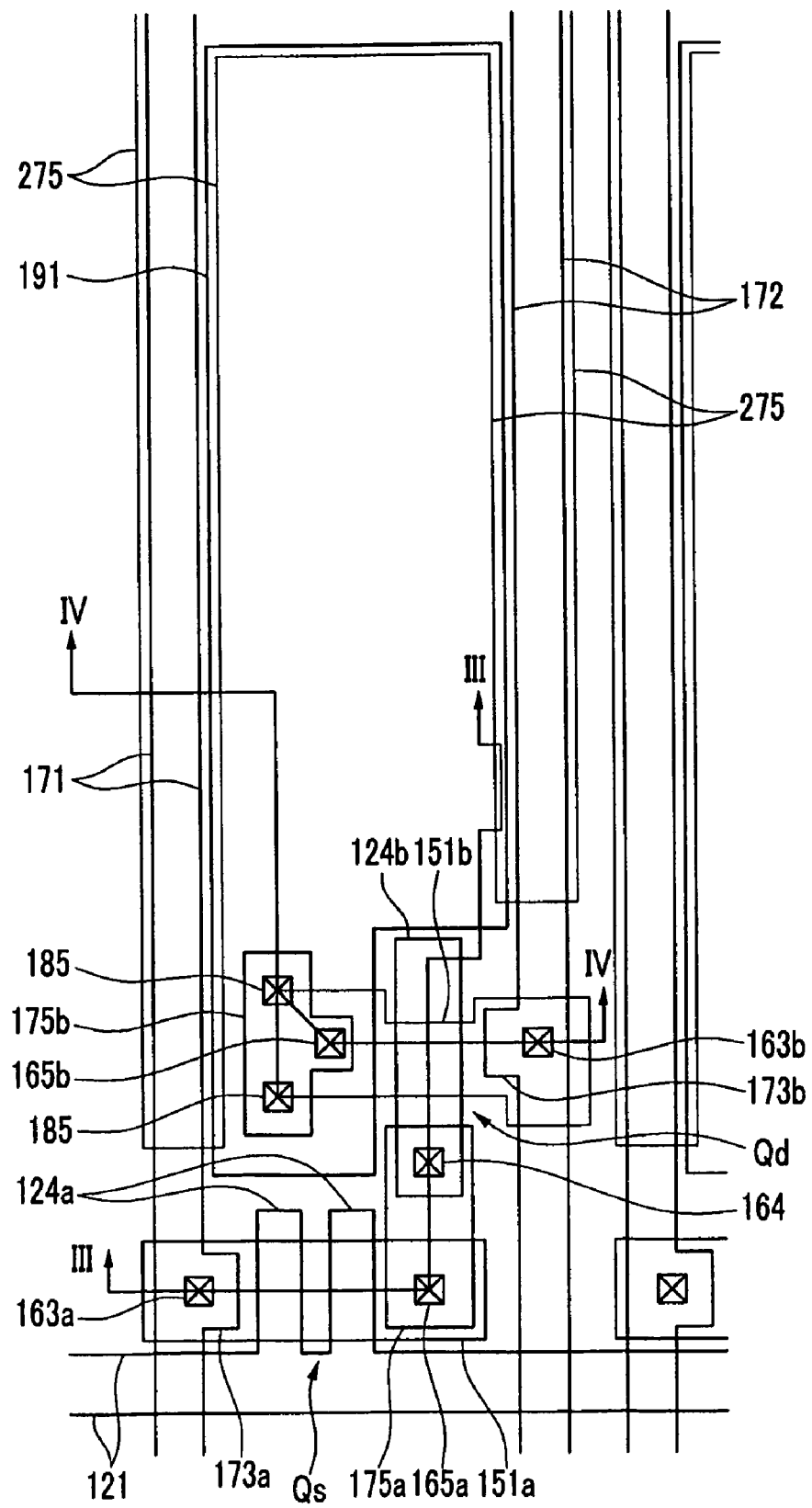
FIG. 2 is a layout view of an organic light emitting device according to an exemplary embodiment of the present invention.
Figure 3:
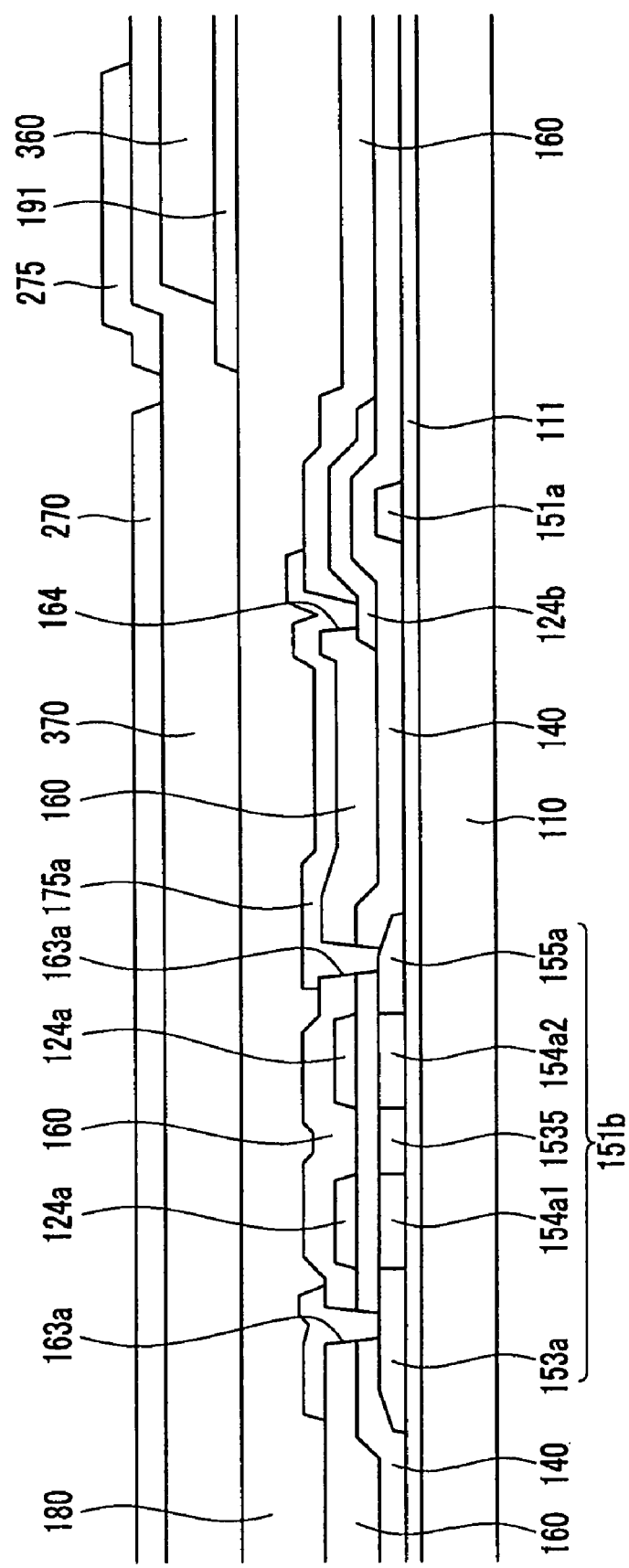
FIG. 3 and FIG. 4 are cross-sectional views of the organic light emitting device shown in FIG. 2 taken along the lines III-III and IV-IV.
Figure 4:
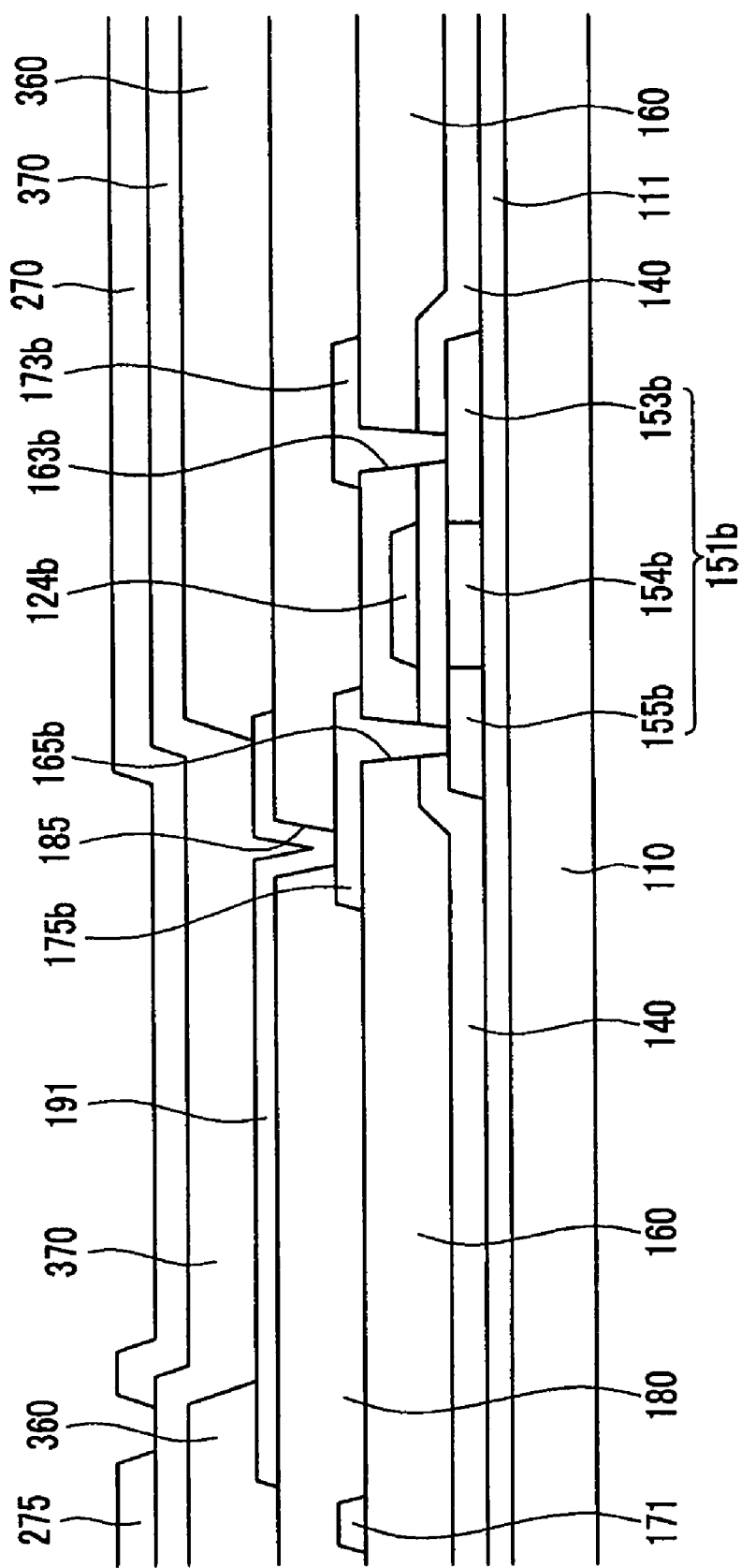
Figure 5:
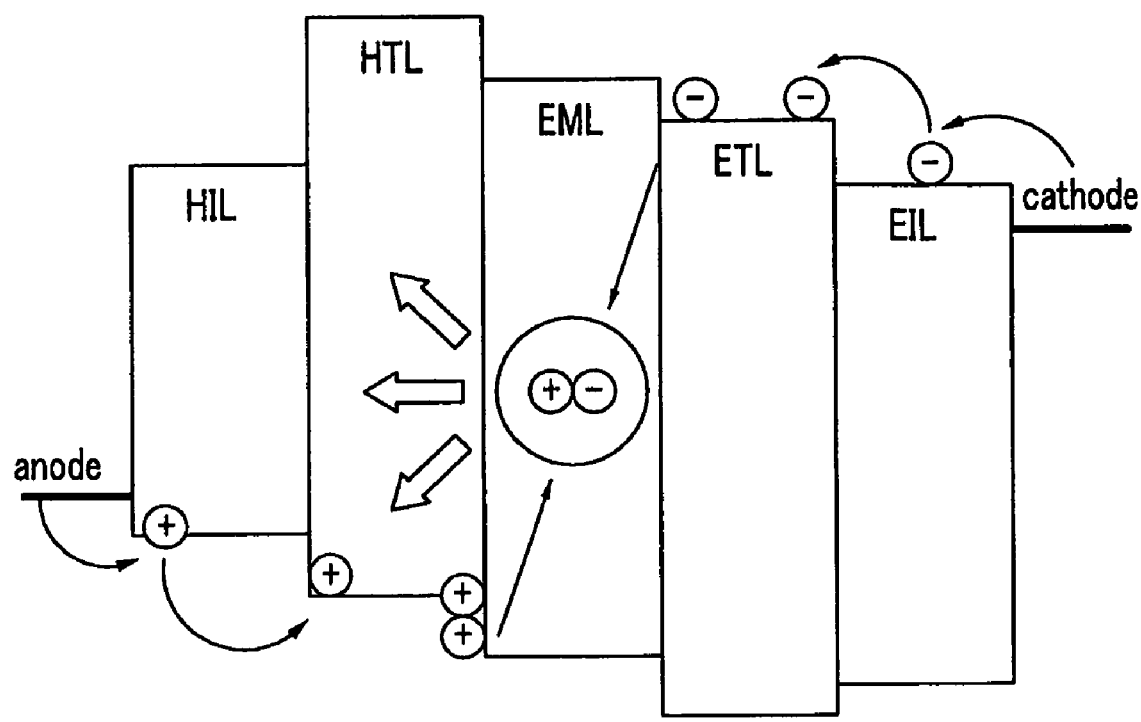
FIG. 5 is a schematic diagram of an organic light emitting element in the organic light emitting device according to an exemplary embodiment of the present invention.

Next, the detailed structure of the organic light emitting device shown in FIG. 1 will be described with reference to FIGS. 2 to 5 as well as FIG. 1. FIG. 2 is a layout view of an organic light emitting device according to an exemplary embodiment of the present invention, FIGS. 3 and 4 are cross-sectional views of the organic light emitting device shown in FIG. 2 taken along the lines III-III and IV-IV, and FIG. 5 is a schematic diagram of an organic light emitting element in the organic light emitting device according to an exemplary embodiment of the present invention.

A blocking layer 111 preferably made of silicon nitride or silicon oxide is formed on a substrate 110 made of a material such as transparent glass. The blocking layer 111 may have a dual-layered structure. A plurality of pairs of first and second semiconductor islands 151a and 151b that are preferably made of polysilicon are formed on the blocking layer 111. The semiconductor islands 151a and 151b respectively include a plurality of extrinsic regions including conductive impurities of an n-type or a p-type, and at least one intrinsic region that does not include conductive impurities.

In the first semiconductor island 151a, the extrinsic region includes first source and drain regions 153a and 155a and an intermediate region 1535, and they are doped with an n-type impurity and separated from each other. The intrinsic region includes a pair of first channel regions 154a1 and 154a2 disposed between the extrinsic regions 153a, 1535, and 155a.

In the second semiconductor island 151b, the extrinsic region includes second source and drain regions 153b and 155b, and they are doped with a p-type impurity and are separated from each other. The intrinsic region includes a second channel region 154b disposed between the second source and drain regions 153b and 155b.

The extrinsic region further includes lightly doped regions (not shown) disposed between the channel regions 154a1, 154a2, and 154b, and the source and drain regions 153a, 155a, 153b, and 155b. The lightly doped regions may be formed at offset regions that do not include impurities.

Alternatively, the extrinsic regions 153a and 155a of the first semiconductor island 151a may be doped with p-type impurities, and the extrinsic regions 153b and 155b of the second semiconductor island 151b may be doped with n-type impurities. The conductive p-type impurity may be boron (B) or gallium (Ga), and the conductive impurity of n-type may be phosphorus (P) or arsenic (As).

A gate insulating layer 140 preferably made of silicon nitride or silicon oxide is formed on the semiconductor islands 151a and 151b and the blocking layer 111. A plurality of gate conductors including a plurality of gate lines 121 having a plurality of first control electrodes 124a and a plurality of second control electrodes 124b are formed on the gate insulating layer 140.

The gate lines 121 transmit gate signals and are substantially extended in the transverse direction. A first control electrode 124a is extended upward from the gate line 121, thereby intersecting the first semiconductor island 151a, and particularly overlapping the first channel regions 154a1 and 154a2. Each gate line 121 may include an end portion having a large area for contact with another layer or an external driving circuit. When a gate driving circuit (not shown) for generating gate signals is formed directly on the substrate 110, the gate lines 121 may extend and be directly connected to the gate driving circuit.

A second control electrode 124b is separated from the gate line 121. The second control electrode 124b overlaps the second channel region 154b of the second semiconductor island 151b.

The gate conductors 121 and 124b may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, or chromium (Cr), tantalum (Ta), titanium (Ti), etc. However, the control electrode 124 may have a multi-layer structure including two conductive layers (not shown) that have different physical properties to each other.

One of the conductive layers may be formed using a metal having low resistivity, such as an aluminum-based metal, a silver-based metal, or a copper-based metal, in order to reduce signal delay or voltage drop. Unlike the above, other conductive layers may be formed using a material having good physical, chemical, and electrical contact characteristics particularly with indium-tin-oxide (ITO) and indium-zinc-oxide (IZO), such as a molybdenum-based metal, chromium, tantalum, titanium, or the like.

Preferred examples of the combination may include a lower chromium film and an upper aluminum (alloy) film, and a lower aluminum (alloy) film and an upper molybdenum (alloy) film. However, the gate conductors 121 and 124b may be made of various metals or conductors, in accordance with embodiments of the present invention.

Side surfaces of the gate conductors 121 and 124b are inclined to the surface of the substrate 110, and an inclination angle thereof is preferably about 30° to 80°.

An interlayer insulating layer 160 is formed on the gate conductors 121 and 124b. The interlayer insulating layer 160 is made of an inorganic insulator such as silicon nitride, silicon oxide, and so on, an organic insulator, or an insulator having a low dielectric ratio. It is preferable that the dielectric constant of the insulator is less than 4.0, for example a-Si:C:O or a-Si:O:F, that is formed through plasma enhanced chemical vapor deposition (PECVD). The interlayer insulating layer 160 may be made of an organic insulator having photosensitivity and may provide a flat surface.

The interlayer insulating layer 160 has a plurality of contact holes 164 exposing the second control electrodes 124b. Also, the interlayer insulating layer 160 and the gate insulating layer 140 have a plurality of contact holes 163a, 163b, 165a, and 165b exposing the source and drain regions 153a, 153b, 155a, and 155b.

A plurality of data conductors including the data lines 171, the driving voltage lines 172, and first and second output electrodes 175a and 175b are formed on the interlayer insulating layer 160. The data lines 171 transmit data signals and extend in a longitudinal direction, thereby intersecting the gate lines 121. Each data line 171 includes a first input electrode 173a connected to the first source region 153a through the contact hole 163a, and may include an end portion having a large area for contact with another layer or an external driving circuit. When a data driving circuit (not shown) for generating data signals is formed directly on the substrate 110, the data line 171 may extend and be directly connected to the data driving circuit.

The driving voltage lines 172 transmit a driving voltage and extend in a longitudinal direction, thereby intersecting the gate lines 121. Each driving voltage line 172 includes a second input electrode 173b connected to the second source region 153b through the contact hole 163b.

The first output electrode 175a is separated from the data line 171 and the driving voltage line 172. The first output electrode 175a is connected to the first drain region 155a through the contact hole 165a, and to the second control electrode 124b through the contact hole 164. The second output electrode 175b is separated from the data line 171, the driving voltage line 172, and the first output electrode 175a, and is connected to the second drain region 155b through the contact hole 165b.

The data conductors 171, 172, 175a, and 175b may be made of a refractory metal such as molybdenum, chromium, tantalum, and titanium, or alloys thereof, and have a multi-layered structure including a refractory metal layer (not shown) and a low resistance conductive layer (not shown). A multi-layered structure includes, for example, a dual-layer of a chromium or molybdenum (alloy) lower layer and an aluminum (alloy) upper layer, and a triple-layer of a molybdenum (alloy) lower layer, an aluminum (alloy) middle layer, and a molybdenum (alloy) upper layer. However, the data conductor 171, 172, 175a, and 175b may be made of various other metals or conductors. It is preferable that side surfaces of the data conductor 171, 172, 175a, and 175b are also inclined to the surface of the substrate 110, and an inclination angle thereof is about 30° to 80° like the gate conductors 121 and 124b.

A passivation layer 180 is formed on the data conductor 171, 172, 175a, and 175b. The passivation layer 180 is made of an inorganic material, an organic material, or a low dielectric ratio insulating material. The passivation layer 180 has a plurality of contact holes 185 exposing the second output electrodes 175b. The passivation layer 180 may have a plurality of contact holes (not shown) exposing the end portions of the data lines 171, and the passivation layer 180 and the interlayer insulating layer 160 may have a plurality of contact holes (not shown) exposing the end portions of the gate lines 121.

A plurality of pixel electrodes 191 are formed on the passivation layer 180. The pixel electrodes 191 are physically and electrically connected to the second output electrodes 175b through the contact holes 185, and may be made of a transparent conductive material such as ITO or IZO, or a reflective conductor such as silver, aluminum, or alloys thereof.

A portion of the pixel electrodes 191 overlaps a storage electrode 275 thereby forming a storage capacitor. This will be described in greater detail herein.

A plurality of contact assistants (not shown) or connecting members (not shown) are formed on the passivation layer 180, and they may be connected to exposed portions of the gate lines 121 and the data lines 171.

Partitions 360 are formed on the passivation layer 180. The partitions 360 define a plurality of openings enclosing edges of the pixel electrodes 191 like a bank, and are made of an organic insulator or an inorganic insulator. The partitions 360 may be made of a photoresist including black pigments, and the partitions 360 function as a light blocking member in this case thereby simplifying the manufacturing process.

An organic light emitting member 370 is formed in openings defined by the partitions 361 on the pixel electrode 191. The organic light emitting member 370 is mainly disposed on the regions enclosed by the partitions 360, and also on the partition 360 or the pixel area. The organic light emitting member 370 as an emission layer is preferably made of an organic material uniquely emitting light of one primary color such as of three primary colors of red, green, and blue.

As shown in FIG. 4, the organic light emitting member 370 has a multi-layer structure including auxiliary layers for improving light emitting efficiency of an emitting layer EML in addition to the emitting layer EML. The auxiliary layers include an electron transport layer ETL and a hole transport layer HTL for adjusting the balance of electrons and holes, and an electron injecting layer EIL and a hole injecting layer HIL for solidifying the injection of electrons and holes. In one implementation, the auxiliary layers may be omitted.

A plurality of common electrodes 270 and a plurality of storage electrodes 275 are formed on the organic light emitting member 370. The common electrode 270 is applied with a common voltage Vcom and is made of a transparent conductive material such as ITO or IZO or a reflective metal including calcium (Ca), barium (Ba), aluminum (Al), magnesium (Mg), aluminum (Al), and silver (Ag).

The storage electrodes 275 are separated from the common electrode 270, overlap a portion of the pixel electrodes 191, and enclose a portion of the edge of each pixel. The storage electrodes 275 are simultaneously formed with the same layer as the common electrode 270 such they are made of the same material as the common electrode 270. A plurality of storage electrodes 275 may be connected to each other. In one aspect, the storage electrodes 275 overlap the portion of the pixel electrodes 191 via the organic light emitting member 370 interposed therebetween.

In the organic light emitting device, the first semiconductor island 151a, the first control electrode 124a connected to the gate line 121, the first input electrode 173a connected to the data line 171, and the first output electrode 175a form the switching thin film transistor Qs, and the channel of the switching thin film transistor Qs is formed on the first channel region 154a1 and 154a2 of the first semiconductor island 151a. The second semiconductor island 151b, the second control electrode 124b connected to the first output electrode 175a, the second input electrode 173b connected to the driving voltage line 172, and the output electrode 175b connected to the pixel electrode form the driving thin film transistor Qd, and the channel of the driving thin film transistor Qd is formed in the second channel region 154b of the second semiconductor island 151b. A pixel electrode 191, an organic light emitting member 370, and the common electrode 270 form an organic light emitting element having the pixel electrode 191 as an anode and the common electrode 270 as a cathode, or vice versa.

In the organic light emitting device according to an exemplary embodiment of the present invention, the pixel electrode 191 and the storage electrode 275 that overlap each other via the organic light emitting member 370 interposed therebetween form the storage capacitor Cst. The switching thin film transistor Qs transmits the data signal of the data line 171 in the response to the gate signal of the gate line 121. The driving thin film transistor Qd flows a current having a magnitude depending on the voltage difference between the second control electrode 124b and the second input electrode 173b according to the data signal. The voltage difference between the second control electrode 124b and the second input electrode 173b is also charged to the storage capacitor Cst and is maintained after the switching thin film transistor Qs is turned off. The organic light emitting diode OLED emits with a strength that changes according to the magnitude of the driving current, thereby displaying the corresponding image.

As above-described, the organic light emitting member 370 has the multi-layered structure including the auxiliary layers as well as the emission layer. Accordingly, the portion of the pixel electrode 191 and the storage electrode line 275 forming the storage capacitor may overlap at least one of the auxiliary layers as well. Accordingly, in addition to the region of the partition 360, the emission layer or at least one layer among the auxiliary layers is formed on the partition 360.

On the other hand, the storage electrode 275 of the organic light emitting device according to an exemplary embodiment of the present invention is applied with the predetermined voltage, and the voltage difference between the storage electrode 275 and the pixel electrode 191 forming the storage capacitor is smaller than the threshold voltage of the organic light emitting member 370. For example, the voltage difference between the storage electrode 275 and the pixel electrode 191 forming the storage capacitor may be about 6V. Accordingly, the organic light emitting member 370 does not flow the current and may be used as the insulator of the storage capacitor.

As above-described, the storage electrode 275 of the organic light emitting device according to an exemplary embodiment of the present invention is formed according to the edge of the display area of the pixel such that it may be formed with the wide region without influence on the aperture ratio of the display area. The storage capacitance of the storage capacitor is proportional to the magnitude of the voltage of the conductors overlapping each other and the area of the conductors. Accordingly, the storage electrode 275 of the organic light emitting device according to an exemplary embodiment of the present invention may be widely formed according to the edge of the display area pixel such that a storage capacitance with the desired magnitude may be formed even though the storage electrode 275 is applied with a smaller voltage.

As above-described, the organic light emitting device according to an exemplary embodiment of the present invention includes the storage capacitor formed according to the edge of the pixel area, and including the storage electrode 275 overlapping the pixel electrode 191 via the organic light emitting member, such that the storage capacitor may be formed without additional wiring for the storage capacitor in the pixel area. Accordingly, the storage capacitance having the desired magnitude is formed, and simultaneously the aperture ratio of the organic light emitting device is improved.

Next, an organic light emitting device according to another exemplary embodiment of the present invention will be described with reference to FIGS. 6 and 7, which are cross-sectional views of an organic light emitting device according to another exemplary embodiment of the present invention. In one aspect, the layered structure of an organic light emitting device according to the present exemplary embodiment is similar to that of FIGS. 2 to 4.

In one embodiment, a blocking layer 111 is formed on a substrate 110, and first and second semiconductor islands 151a and 151b are formed thereon. A gate insulating layer 140 is formed on the semiconductor islands 151a and 151b and the blocking layer 111, a gate line 121 including a plurality of first control electrodes 124a and a plurality of second control electrodes 124b is formed on the gate insulating layer 140, and an interlayer insulating layer 160 is formed thereon.

In one embodiment, a data line 171, a driving voltage line 172, and first and second output electrodes 175a and 175b are formed on the interlayer insulating layer 160, and a passivation layer 180 is formed thereon. A partition 360 and a pixel electrode 191 are formed on the passivation layer 180 and an organic light emitting member 370 is formed thereon, and a common electrode 270 and a storage electrode 275 are formed on the organic light emitting member 370.

However, in one aspect, differently from the organic light emitting device of FIG. 2 to FIG. 4, the pixel electrode 191 is formed on the partition 360 and the passivation layer 180. In the previous exemplary embodiment, the pixel electrode 191 is formed on the partition 360, and a portion of the pixel electrode 191 overlaps the storage electrode 275 via the partition 360 as well as the organic light emitting member 370, however in the present exemplary embodiment, the pixel electrode 191 is formed on the partition 360 such that the storage electrode 275 overlaps the pixel electrode 191 via only the organic light emitting member 370.

The storage capacitance of the capacitor is inversely proportional to the interval between two conductors under the same other conditions. Accordingly, the storage electrode 275 of the organic light emitting device of the present exemplary embodiment overlaps the pixel electrode 191 via only the organic light emitting member 370 without the partition 360 such that a larger storage capacitance may be formed.

Figure 6:
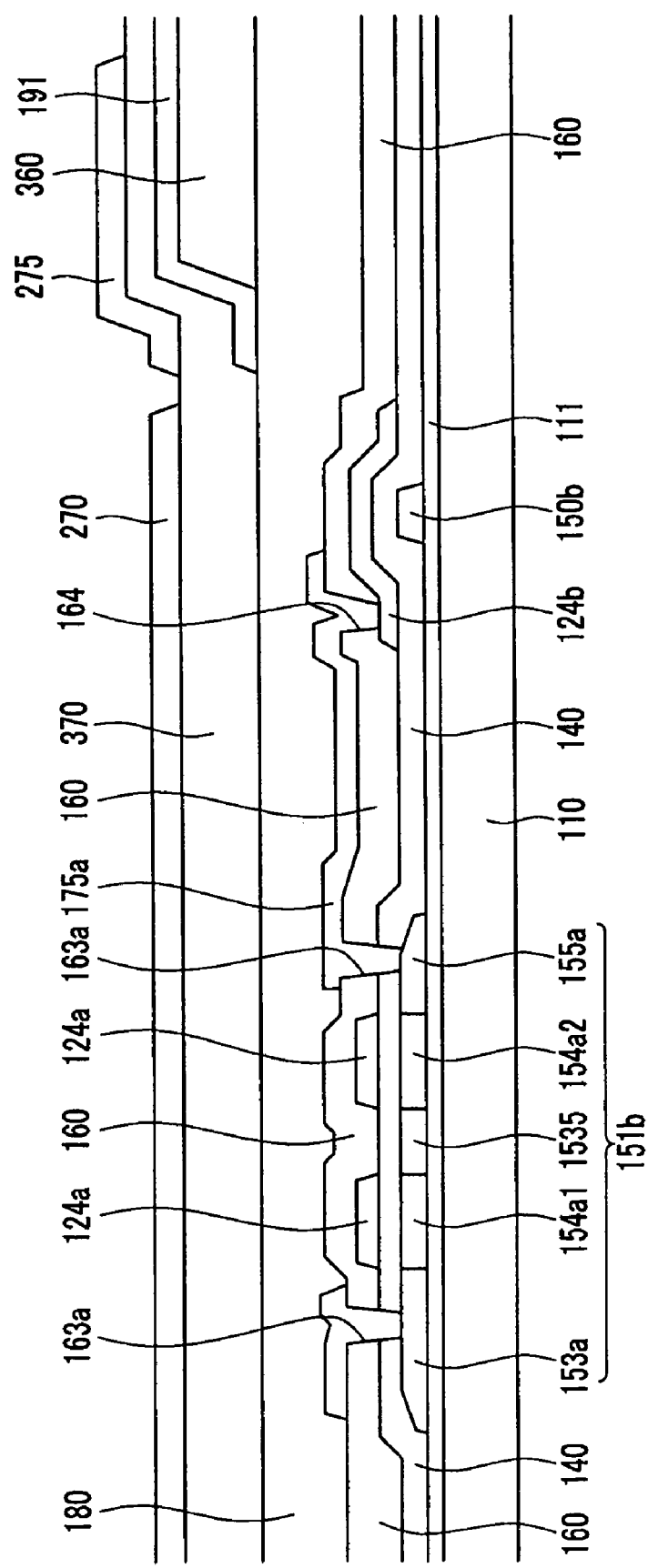
FIG. 6 and FIG. 7 are cross-sectional views of a portion of the organic light emitting device according to one exemplary embodiment of the present invention.
Figure 7:
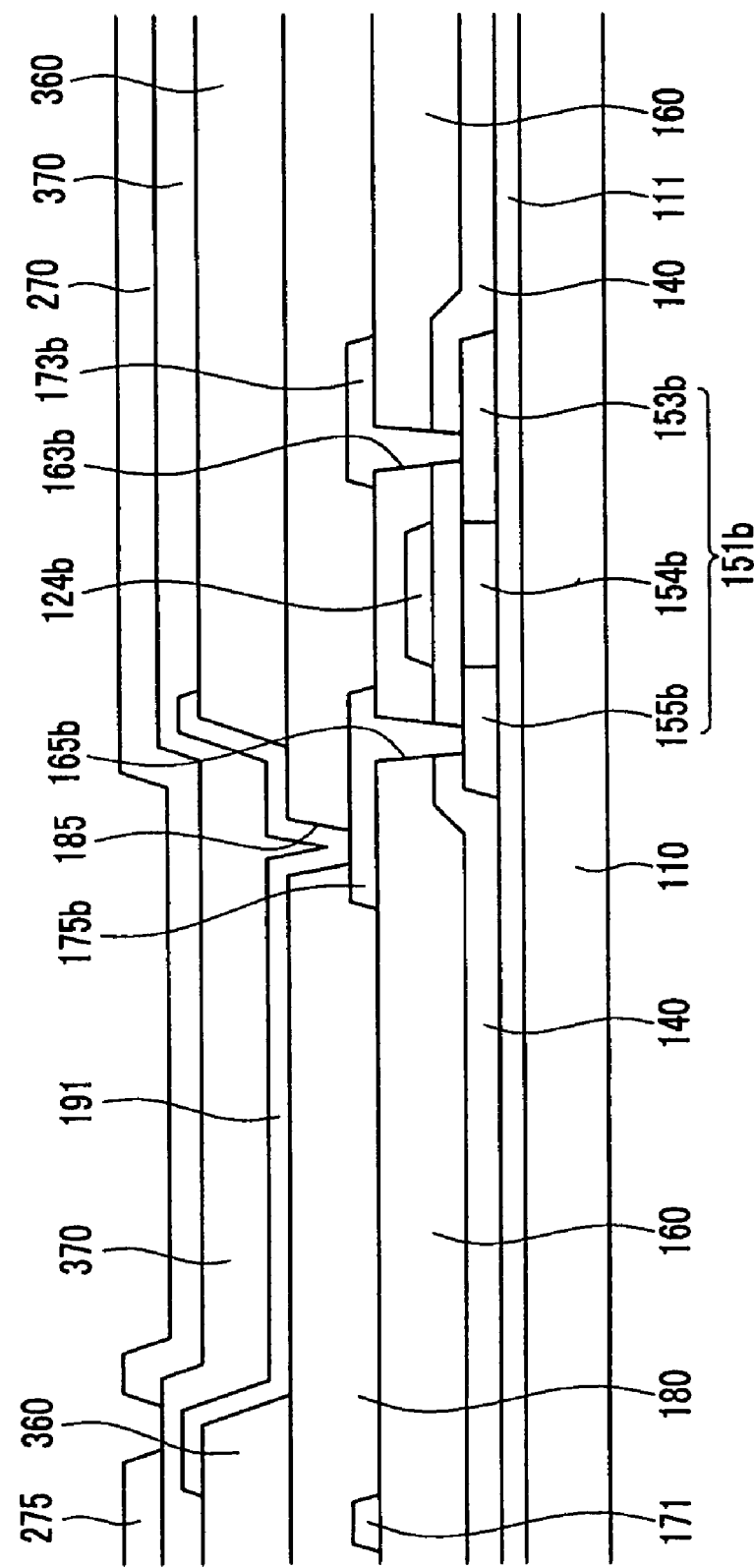
Figure 8:
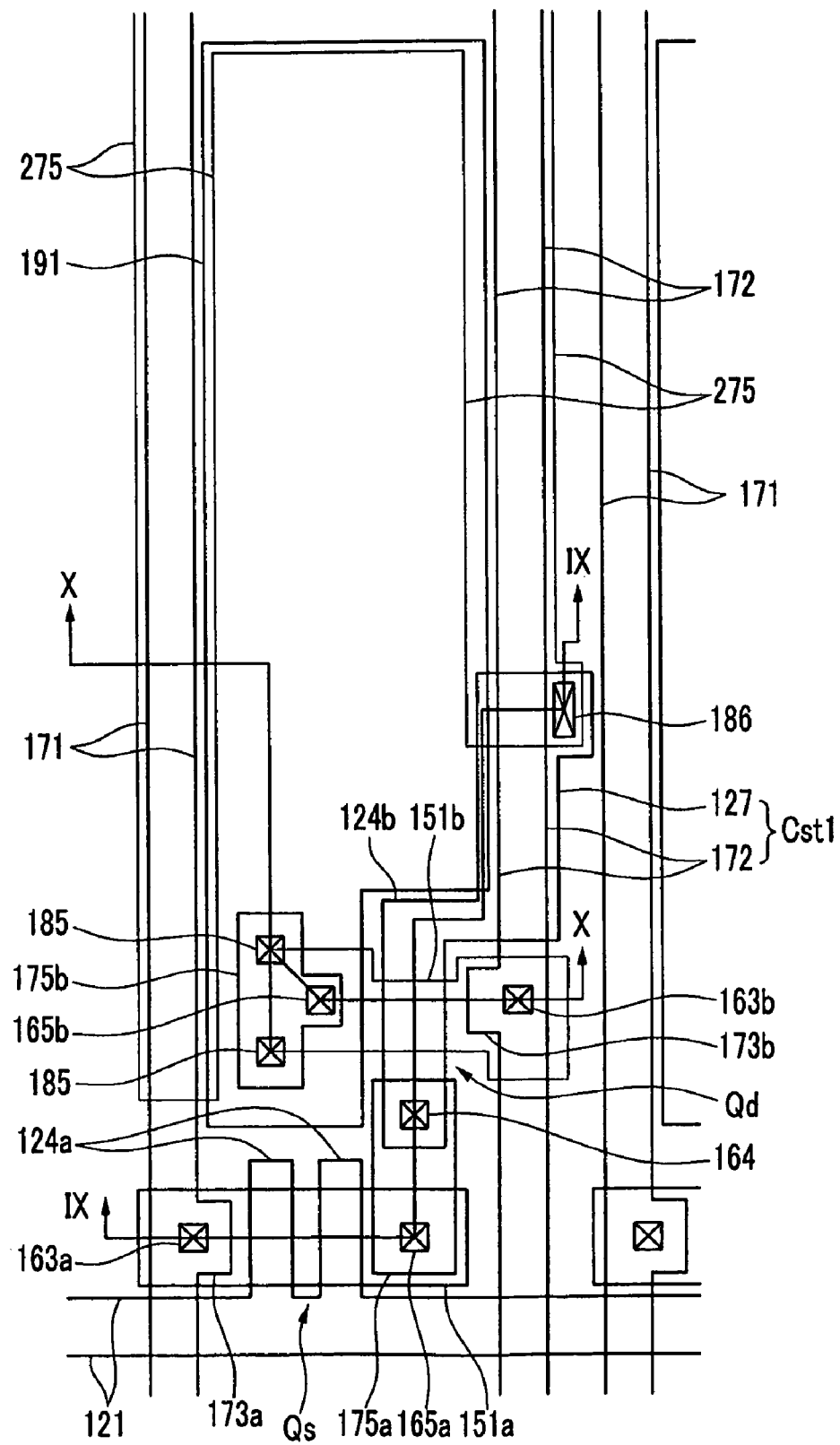
FIG. 8 is a layout view of an organic light emitting device according to another exemplary embodiment of the present invention.
Figure 9:
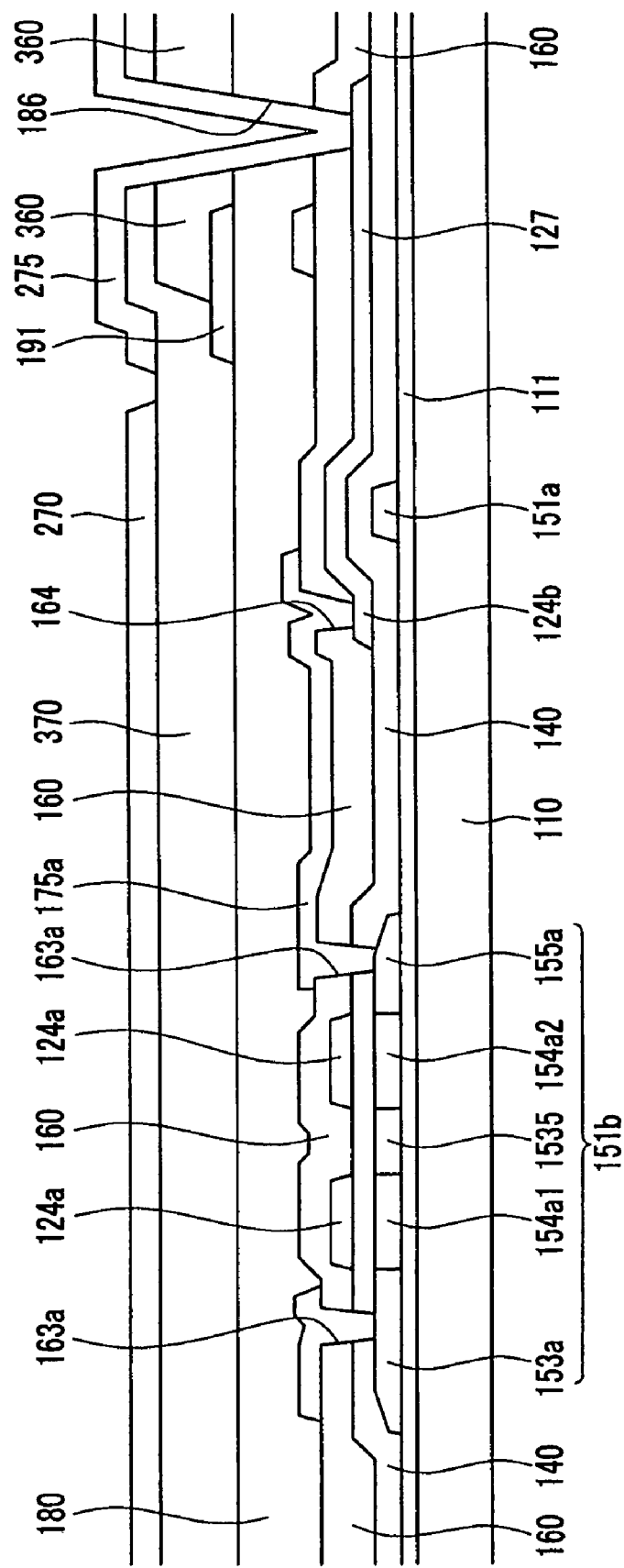
FIG. 9 and FIG. 10 are cross-sectional views of the organic light emitting device shown in FIG. 8 taken along the lines IX-IX and X-X.
Figure 10:
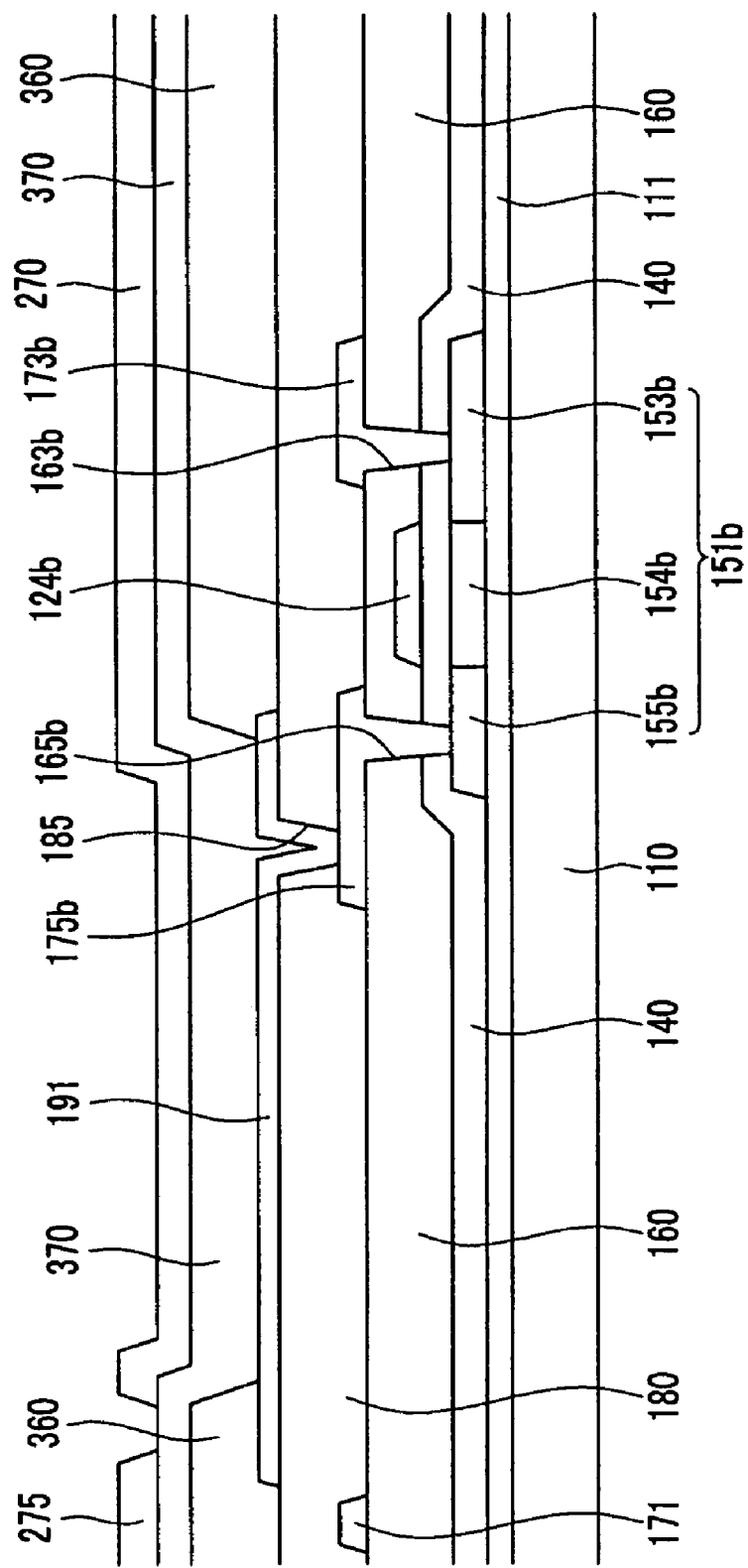

Various characteristics of the thin film transistor array panel as shown in FIGS. 2 to 4 are applicable to the thin film transistor array panel as shown in FIGS. 6 and 7. Next, an organic light emitting device according to another exemplary embodiment of the present invention will be described with reference to FIGS. 8 to 10. FIG. 8 is a layout view of an organic light emitting device according to the current exemplary embodiment of the present invention, and FIGS. 9 and 10 are cross-sectional views of the organic light emitting device shown in FIG. 8 taken along the lines IX-IX and X-X.

The layered structure of an organic light emitting device according to the present exemplary embodiment is the similar to that of FIGS. 2 to 4.

A blocking layer 111 is formed on a substrate 110, and first and second semiconductor islands 151a and 151b are formed thereon. A gate insulating layer 140 is formed on the semiconductor islands 151a and 151b and the blocking layer 111, a gate line 121 including a first control electrode 124a and a plurality of the second control electrodes 124b are formed on the gate insulating layer 140, and an interlayer insulating layer 160 is formed thereon.

A data line 171, a driving voltage line 172, and first and second output electrodes 175a and 175b are formed on the interlayer insulating layer 160, and a passivation layer 180 is formed thereon. A pixel electrode 191 are formed on the passivation layer 180, a partition 361 is formed on the pixel electrode 191 and the passivation layer 180, an organic light emitting member 370 is formed on the partition 360 and the pixel electrode 191, and a common electrode 270 and a storage electrode 275 are formed on the organic light emitting member 370.

However, in one aspect, differently from the organic light emitting device of FIGS. 2 to 4, the second control electrode 124b further includes a protrusion 127 extending toward the driving voltage line 172. Also, the storage electrode 275 is connected to the protrusion 127 of the second control electrode 124b through a contact hole 186 of the partition 360, the passivation layer 180, and the interlayer insulating layer 160.

Accordingly, the storage electrode 275 is applied with the same voltage as the second control electrode 124b that is the control terminal of the driving thin film transistor Qd, and overlaps the pixel electrode 191 via the organic light emitting member 370 thereby forming the storage capacitor. Also, a protrusion 127 of the second control electrode 124b overlaps a portion of the driving voltage line 172 via the interlayer insulating layer 160, thereby forming an additional storage capacitor.

The storage electrode 275 of the organic light emitting device of the present exemplary embodiment is applied with a predetermined voltage in the pixel, differently from the previous exemplary embodiment in which the storage electrode is applied with the predetermined voltage from the external. Also, the storage electrode 275 and the pixel electrode 191 overlap via the organic light emitting member 370 thereby forming the storage capacitor, and simultaneously the protrusion 127 of the second control electrode 124b and the driving voltage line 172 overlap via the interlayer insulating layer 160, thereby forming the additional storage capacitor such that the storage capacitance is increased.

In the organic light emitting device of the present exemplary embodiment, even though the area of the protrusion of the second control electrode 124b is small, the storage capacitance may be formed through the storage electrode 275 such that the desired storage capacitance may be obtained without a reduction of the aperture ratio of the organic light emitting device.

Various characteristics of the thin film transistor array panel as shown in FIGS. 2 to 4 are applicable to the thin film transistor array panel as shown in FIGS. 8 to 10. Next, an organic light emitting device according to another exemplary embodiment of the present invention will be described with reference to FIGS. 11 and 12, which are cross-sectional views of an organic light emitting device according to another exemplary embodiment of the present invention.

The layered structure of an organic light emitting device according to the present exemplary embodiment is the similar to that of FIGS. 8 to 10. A blocking layer 111 is formed on a substrate 110, and first and second semiconductor islands 151a and 151b are formed thereon. A gate insulating layer 140 is formed on the semiconductor islands 151a and 151b and the blocking layer 111, a gate line 121 including a plurality of first control electrodes 124a and a plurality of second control electrodes 124b are formed on the gate insulating layer 140, and an interlayer insulating layer 160 is formed thereon. The second control electrode 124b includes a protrusion 127 extending toward the driving voltage line 172. A data line 171, a driving voltage line 172, and first and second output electrodes 175a and 175b are formed on the interlayer insulating layer 160, and a passivation layer 180 is formed thereon.

A partition 360 and a pixel electrode 191 are formed on the passivation layer 180, an organic light emitting member 370 is formed thereon, and the common electrode 270 and the storage electrode 275 are formed on the organic light emitting member 370. The storage electrode 275 is connected to the protrusion 127 of the second control electrode 124b through the contact hole 186 of the partition 360, the passivation layer 180, and the interlayer insulating layer 160.

However, in one aspect, differently from the organic light emitting device shown in FIG. 8 to FIG. 10, the pixel electrode 191 is disposed on the partition 360 and the passivation layer 180. In the previous exemplary embodiment, the pixel electrode 191 is formed on the partition 360 such that the portion of the pixel electrode 191 overlaps the storage electrode 275 via the partition 360 as well as the organic light emitting member 370, however in the present exemplary embodiment, the pixel electrode 191 is formed on the partition 360 such that the storage electrode 275 overlaps the portion of the pixel electrode 191 via only the organic light emitting member 370. The storage electrode 275 of the organic light emitting device according to the present exemplary embodiment overlaps the pixel electrode 191 only via the organic light emitting member 370, not the partition 360, such that a large storage capacitance may be formed.

Figure 11:
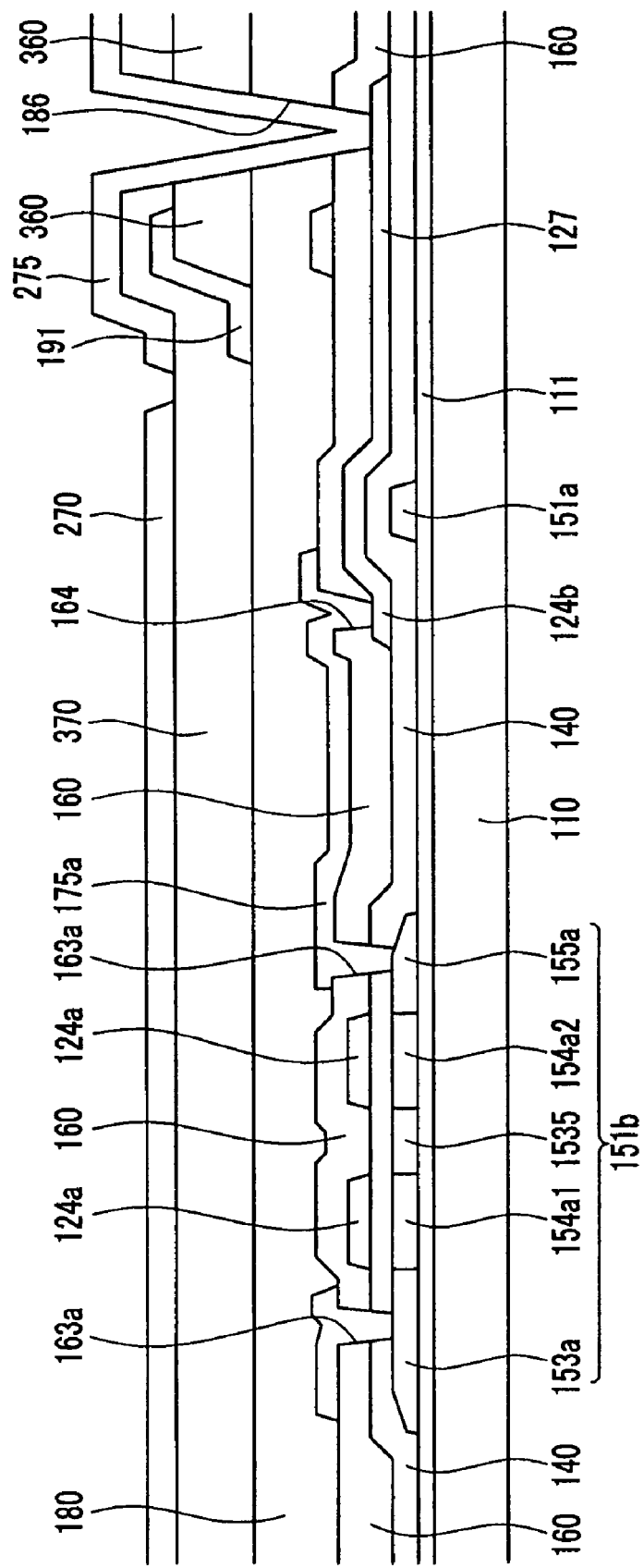
FIG. 11 and FIG. 12 are cross-sectional views of the portion of an organic light emitting device according to another exemplary embodiment of the present invention.
Figure 12:
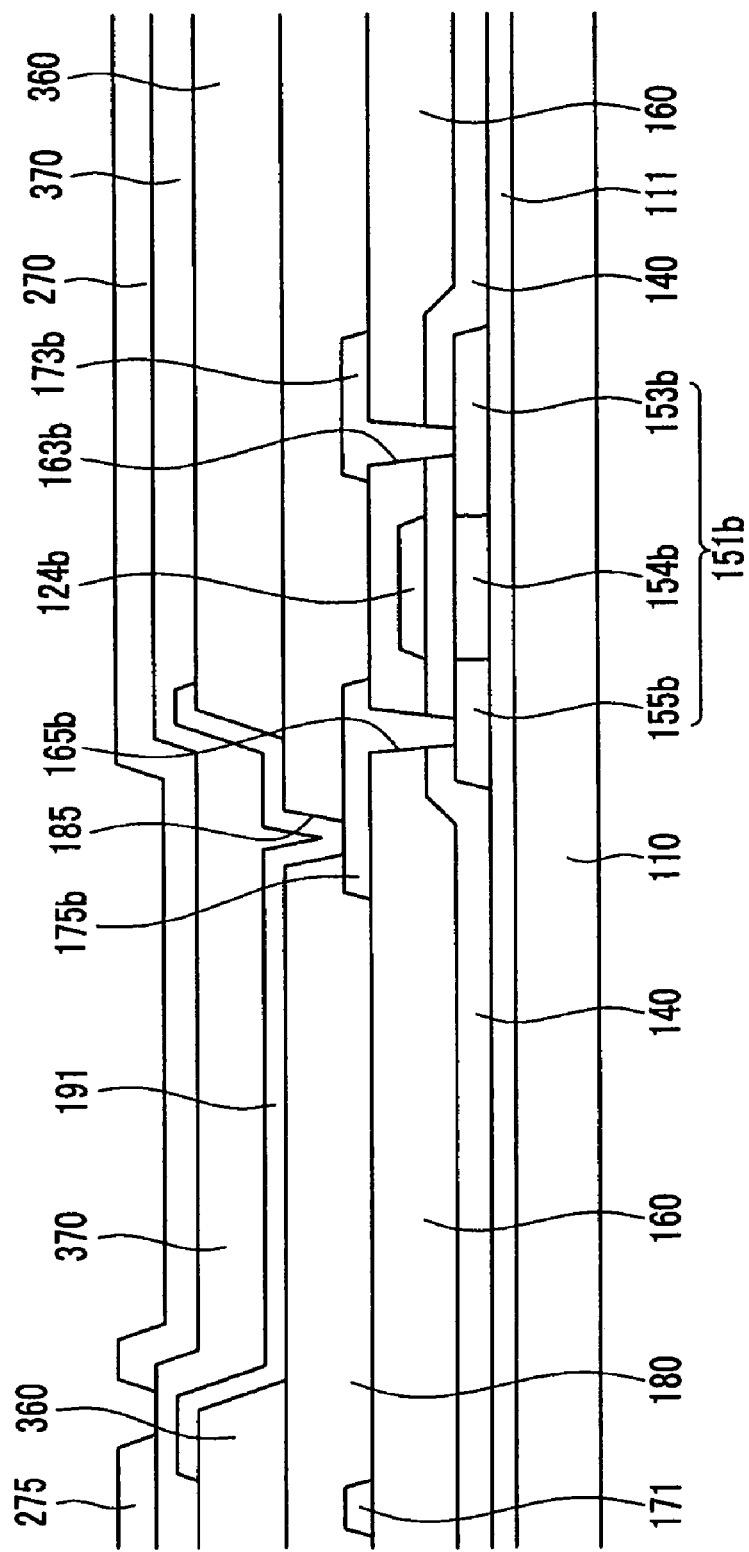

Various characteristics of the thin film transistor array panel as shown in FIGS. 8 to 10 are applicable to the thin film transistor array panel as shown in FIGS. 11 and 12.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting device comprising:
    a pixel electrode;
    an organic light emitting member formed on the pixel electrode;
    a common electrode formed on the organic light emitting member; and
    a storage capacitor including a first conductive layer and a second conductive layer overlapping each other,
    wherein at least a portion of the organic light emitting member is disposed between the first conductive layer and the second conductive layer; and
    wherein each of the first and second conductive layers is different from the common electrode.

2. The organic light emitting device of claim 1, wherein the first conductive layer is disposed on the same layer as the pixel electrode, and wherein the second conductive layer is disposed on the same layer as the common electrode.

3. The organic light emitting device of claim 2, wherein the second conductive layer is separated from the common electrode.

4. The organic light emitting device of claim 1, wherein the second conductive layer is applied with a voltage from an external power source.

5. The organic light emitting device of claim 2, wherein the second conductive layer is applied with a voltage from an external power source.

6. The organic light emitting device of claim 4, wherein a voltage difference between the first conductive layer and the second conductive layer is less than a light emitting threshold voltage of the organic light emitting member.

7. The organic light emitting device of claim 5, wherein a voltage difference between the first conductive layer and the second conductive layer is less than a light emitting threshold voltage of the organic light emitting member.

8. The organic light emitting device of claim 1, wherein the second conductive layer encloses a portion of the pixel electrode.

9. The organic light emitting device of claim 2, wherein the second conductive layer encloses a portion of the pixel electrode.

10. The organic light emitting device of claim 1, comprising:
    a gate line;
    a data line intersecting the gate line;
    a first transistor connected to the gate line and the data line;
    a second transistor having a gate electrode connected to a drain electrode of the first transistor;
    a third conductive layer connected to the gate electrode of the second transistor, wherein
    the second conductive layer contacts the third conductive layer.

11. The organic light emitting device of claim 10, wherein the first conductive layer is disposed on the same layer as the pixel electrode, and wherein the second conductive layer is disposed on the same layer as the common electrode.

12. The organic light emitting device of claim 10, wherein the second conductive layer is applied with a voltage from the third conductive layer.

13. The organic light emitting device of claim 11, wherein the second conductive layer is applied with a voltage from the third conductive layer.

14. The organic light emitting device of claim 11, wherein the second conductive layer is separated from the common electrode.

15. The organic light emitting device of claim 10, wherein the second conductive layer encloses a portion of the pixel electrode.

16. The organic light emitting device of claim 11, wherein the second conductive layer encloses a portion of the pixel electrode.

17. The organic light emitting device of claim 1, wherein the second conductive layer is made of a transparent conductive material.

18. The organic light emitting device of claim 17, wherein the second conductive layer includes indium-tin-oxide or indium-zinc-oxide.

19. The organic light emitting device of claim 12, wherein the second conductive layer includes indium-tin-oxide or indium-zinc-oxide.

20. The organic light emitting device of claim 1, wherein the organic light emitting member include an organic emission layer and a plurality of auxiliary layers, and wherein at least a portion of the organic emission layer and at least a portion of the plurality of auxiliary layers are disposed between the first conductive layer and the second conductive layer.

* * * * *